United States Patent [19]

Lee et al.

[11] Patent Number: 4,683,488
[45] Date of Patent: Jul. 28, 1987

[54] LATCH-UP RESISTANT CMOS STRUCTURE FOR VLSI INCLUDING RETROGRADED WELLS

[75] Inventors: William W. Y. Lee, Fullerton; Kuang-Yeh Chang, Fountain Valley, both of Calif.

[73] Assignee: Hughes Aircraft Company, Los Angeles, Calif.

[21] Appl. No.: 835,447

[22] Filed: Feb. 28, 1986

Related U.S. Application Data

[63] Continuation of Ser. No. 594,589, Mar. 29, 1984, abandoned.

[51] Int. Cl.$^4$ .............................................. H01L 27/02
[52] U.S. Cl. .................................. 357/42; 357/23.11; 357/38; 357/52; 357/56; 357/90
[58] Field of Search ................. 357/23.11, 42, 38, 56, 357/52, 90

[56] References Cited

U.S. PATENT DOCUMENTS

| | | | |
|---|---|---|---|
| 3,748,187 | 7/1973 | Aubuchon et al. | 148/1.5 |
| 3,853,633 | 10/1974 | Armstrong . | |
| 3,999,213 | 12/1976 | Brandt et al. | 357/42 |
| 4,016,594 | 4/1977 | Shappir | 357/42 |
| 4,032,372 | 6/1977 | Vora | 357/42 |
| 4,173,767 | 11/1979 | Stevenson | 357/44 |
| 4,203,126 | 5/1980 | Yim et al. | 357/42 |
| 4,223,334 | 9/1980 | Gasner et al. | 357/42 |
| 4,325,169 | 4/1982 | Ponder et al. | 357/42 |
| 4,466,171 | 8/1984 | Jochems | 357/42 |
| 4,503,451 | 3/1985 | Lund et al. | 357/42 |
| 4,574,467 | 3/1986 | Halfacre et al. | 357/42 |

FOREIGN PATENT DOCUMENTS 59-32163  2/1984  Japan .

OTHER PUBLICATIONS

IEEE Spectrum, vol. 20, No. 10, Oct. 1983, R. D. Davies, "The Case for CMOS", pp. 26-32.
Electronics International, vol. 56, No. 15, Jul. 1983, M. A. Harris, "Scaled Down CMOS May Catapult GE to Chip Forefront", pp. 47-48.
Electronics International, vol. 54, No. 20, Oct. 1981, F. Lee et al, "Cool-Running 16 K RAM Rivals N-Channel MOS Performance", pp. 120-123.
International Electron Devices Meeting, Technial Digest, Dec. 13-15, 1982, L. C. Parrillo et al, "Twin Tub CMOS II-An Advanced VLSI Technology", pp. 706-709.
Patents Abstracts of Japan, vol. 5, No. 167, Oct. 24, 1981, & Japan 5694670, Fujitsu K.K., Jul. 31, 1981.
Patents Abstracts of Japan, vol. 8, No. 119, Jun. 1984, & Japan 5932163, Nippon Denki K.K., Feb. 21, 1984.
Patents Abstracts of Japan, vol. 6, No. 136, Jul. 23, 1982, & Japan 5762565, Nippon Kenki K.K., Apr. 15, 1982.
Electronics, vol. 44, No. 16, Aug. 2, 1971, pp. 103–106.
"Inside CMOS Technology," Pawloski, Moroyan, Altnether, *BYTE*, vol. 8, No. 9, Sep. 1983, pp. 94–122.
"The Case for CMOS," Davies, *IEEE Spectrum*, vol. 20, No. 10, Oct. 1983, pp. 26–32.
"Enhancements eliminate CMOS SCR Latch-up," L. Wakeman, *Electronics Industry*, Oct. 1983, pp. 55 and 57.
"A Better Understanding of CMOS Latch-up," G. I. Hu, *IEEE Transactions On Electron Devices*, vol. ED-31, No. 1, Jan. 1984, pp. 62–67.
"Latchup Model for the Parasitic p-n-p-n Path in Bulk CMOS," R. C. Fang and J. L. Moll, IEEE Transactions On Electron Devices, vol. ED-31, No. 1, Jan. 1984, pp. 113–120.

*Primary Examiner*—Joseph E. Clawson, Jr.
*Attorney, Agent, or Firm*—J. E. Szabo; K. W. Float; A. W. Karambelas

[57] ABSTRACT

A complementary metal oxide semiconductor (CMOS) structure having the source and drain regions of individual transistor devices separated from the peak impurity concentrations of the respective N- and P-wells of such devices. The CMOS structure includes trenches between the individual transistor devices, and highly doped field regions are formed in the bottom of the trenches. Each N- and P-well includes a retrograde impurity concentration profile and extends beneath adjacent trenches.

7 Claims, 3 Drawing Figures

LATCH-UP RESISTANT CMOS STRUCTURE FOR VLSI INCLUDING RETROGRADED WELLS

This application is a continuation of application Ser. No. 594,589, filed Mar. 29, 1984, now abandoned.

BACKGROUND OF THE INVENTION

1. Field of the Invention

The disclosed invention relates to complementary metal oxide semiconductor (CMOS) integrated circuit structures, and is particularly directed to a latch-up resistant CMOS integrated circuit.

2. Description of Background Art

Monolithic CMOS integrated circuits are well known and include a plurality of N-channel and P-channel metal oxide semiconductor (MOS) transistors formed in a common silicon substrate. The major advantages of CMOS technology include low power dissipation, high noise immunity, a large supply voltage tolerance, symmetrical switching characteristics, and ease of circuit design. Despite such advantages, CMOS technology was not generally utilized until recently for very-large-scale-integration (VLSI) designs since the CMOS process technology is complex and expensive. However, with the continuous reduction in device (e.g. transistor) size and the advent of the VLSI era, CMOS technology has become a significant choice for VLSI designs, where perhaps the most important advantage of CMOS technology is low power consumption, since heat generation becomes a more significant factor as device density increases. Another advantage of CMOS technology is ease of circuit design.

As packing density increases in CMOS integrated circuits, a well-known phenomenon known as latch-up is more likely to occur. Latch-up occurs when a pair of parasitic bipolar transistors formed by adjacent N-channel and P-channel devices become uncontrollably conductive. Effectively, a silicon-controlled rectifier (SCR) is formed by the parasitic transistors and may be triggered, for example, by excessive input voltages.

The phenomenon of latch-up is analyzed in the articles "A Better Understanding of CMOS Latch-up," G.J. Hu, *IEEE Transactions On Electron Devices*, Vol. ED-31, No. 1, January 1984, pp. 62–67; and "Latchup Model for the Parasite p-n-p-n Path in Bulk CMOS," R. C. Fang and J. L. Moll, *IEEE Transactions On Electron Devices*, Vol. ED-31, No. 1, January 1984, pp. 113–120.

Present techniques for avoiding latch-up include the use of guard rings, which are heavily doped areas around each device. However, guard rings take up valuable chip area and thereby reduce packing density.

Another latch-up prevention structure is set forth in U.S. Pat. No. 4,172,767 issued on Nov. 6, 1979 to Stevenson and assigned to Hughes Aircraft Company. The Stevenson structure utilizes an additional region between complementary transistors, wherein the additional region is of a type opposite the type of the substrate material. Specifically, the additional region includes a heavily doped channel portion near the surface and lightly doped channel portion which extends downwardly from the heavily doped channel portion. However, it appears that the additional doped region would limit device packing density and would involve additional complex fabrication processes.

A presently proposed technique for latch-up prevention is the use of deep but narrow grooves to physically isolate the transistor devices. A depth of 5 to 7 micrometers is believed to be required while width should be maintained at 1 to 1.5 micrometers. This technique is discussed in an article "The Case for CMOS," R. D. Davies, *IEEE Spectrum* (October 1983), Vol. 20, No. 10, pp. 26–32. However, deep narrow groove isolation presents processing difficulties, which apparently have not yet been overcome. To the extent that narrow groove isolation may be capable of being achieved, it is believed that unacceptable structural instabilities may exist. Moreover, deep narrow groove isolation causes device sidewall leakages and limits utilization design flexibility. Further, while deep groove isolation reduces the probability of latch-up, it does not eliminate it. Deep narrow groove isolation has not been shown to be commercially practical.

The above-referenced Davies article also discusses a retrograde well, wherein the peak well-dopant concentration is below the substrate surface, as another proposed formation for helping to suppress latch-up. However, the article points out that the latch-up suppression of retrograding apparently has not been achieved in practice since a sufficiently small surface dopant concentration relative to the peak concentration has not yet been achieved.

SUMMARY OF THE INVENTION

It is therefore an object of the invention to provide a latch-up resistant CMOS structure for VLSI.

It is also an object of the invention to provide a latch-up resistant CMOS structure for VLSI which achieves high device packing density.

Another object of the invention is to provide a latch-up resistant CMOS structure which provides for flexible layout design and for flexible application design.

Still another object of the invention is to provide a latch-up resistant CMOS structure which is efficiently fabricated.

A further object of the invention is to provide a latch-up resistant CMOS structure which provides for physical and electrical isolation of the devices.

Still a further object of the invention is to provide a latch-up resistant CMOS structure for VLSI which has an increased source-drain breakdown voltage.

Another object of the invention is to provide a CMOS structure for VLSI wherein the product of the gains of the parasitic bipolar transistors is less than one so that latch does not occur.

Still another object of the invention is to provide a CMOS structure that will operate after being subjected to high radiation dosage and is resistant to latch-up when operating in a high radiation environment.

The foregoing and other objects and purposes of the invention are achieved in a CMOS structure which includes a shallow trench formation having a depth of less than 2 micrometers (microns) to separate the individual transistor devices and well formations for each device wherein each well has its peak doping density substantially below the substrate surface. Each well formation extends beneath the trench formation. The bottoms of the trench formation contains shallow heavily doped field regions.

BRIEF DESCRIPTION OF THE DRAWING

The advantages and features of the invention will be readily understood by persons skilled in the art from the following detailed description when read in conjunction with the drawing wherein.

DETAILED DESCRIPTION

Figure 1:
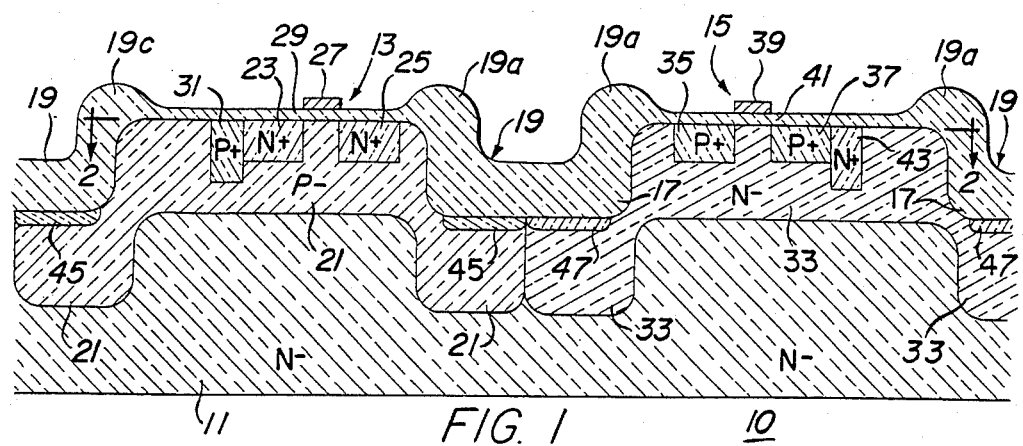
FIG. 1 is a partial cross-sectional schematic of the CMOS structure of the invention.

In the following description and in the several figures of the drawing, like elements are identified with like reference numerals.

Referring now to FIG. 1, shown therein is a cross-sectional schematic of a two transistor section 10 of an integrated circuit which includes a common substrate 11 that is a lightly doped N-type material. N-channel and P-channel transistor devices are formed on the common substrate 11, and the two transistor section 10 includes an N-channel transistor 13 and a P-channel transistor 15. Between each of the transistors of the integrated circuit is a trench, as is shown by the trenches 17.

Figure 2:
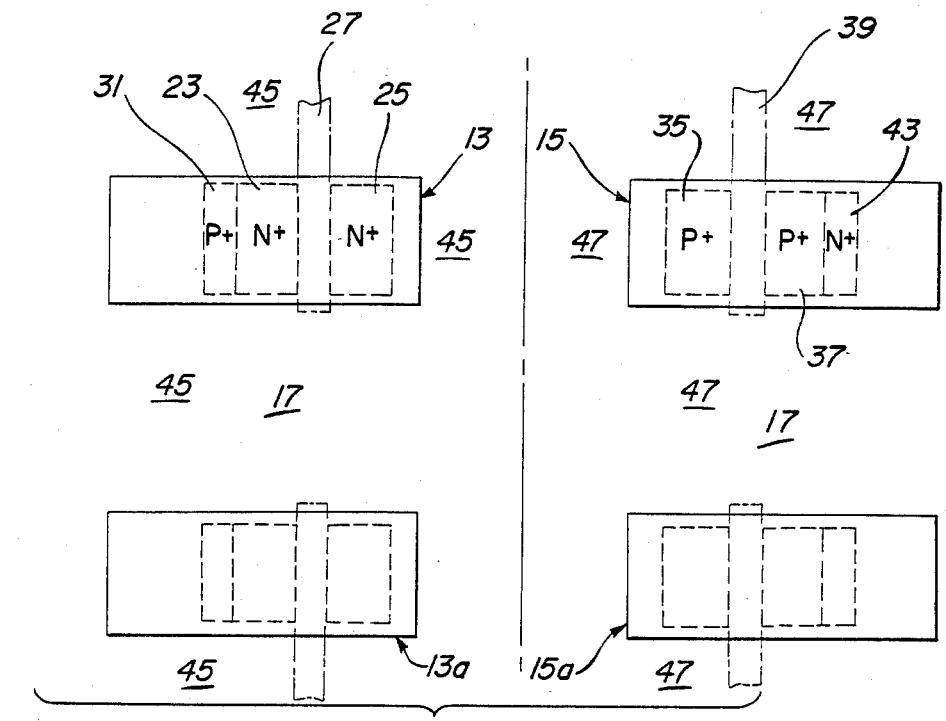
FIG. 2 is a top plan view of a portion of the disclosed CMOS structure.

Referring to FIG. 2, shown therein are the N-channel transistor 13 and the P-channel transistor 15, along with another N-channel transistor 13a and another P-channel transistor 15a. FIG. 2 schematically depicts the trenches between the individual transistor devices.

By way of example, the trenches 17 between devices of opposite type, such as the transistors 13 and 15 may be about 0.9 microns deep and about 4 microns wide. Between devices of the same type, such as the transistors 13 and 13a shown in FIG. 2, the trenches 17 may be about 0.9 microns deep and about 2 to 4 microns wide. The trenches 17 are filled partially with field oxide 19.

The N-channel transistor 13 is formed in a P-well 21 formed in the substrate 11. The P-well 21 has a retrograde impurity concentration profile wherein the peak impurity concentration is substantially below the substrate surface, instead of at the surface. For example, the peak concentration may be about 1 micron below the substrate surface. The P-well 21 extends beneath adjacent trenches 17 and extends further downwardly into the substrate 11 beneath the trenches 17. Beneath the trench regions the peak impurity concentration would, for example, also be about 1 micron below the substrate surface in the trench regions.

The N-channel transistor 13 includes an N-type source region 23 and an N-type drain region 25. The source region 23 and drain region 25 are relatively shallow and are separated from the peak impurity concentration of the P-well 21 as a result of the retrograde impurity concentration profile. By way of example, the source and drain regions may have depths of about one-fourth of a micron. A polycrystalline silicon (polysilicon) gate 27 is located above the P-well portion between the source region 23 and the drain region 25, and is isolated by a gate oxide layer 29. The gate oxide layer 29 merges into the field oxide 19 in the trenches 17, and a "bird's beak" 19a is formed.

A heavily doped P-type region 31 is formed in the P-well 21 to provide a contact for the P-well 21 which is typically connected to ground (connection not shown). The P-type region 31 is usually contiguous to the source region 23. In practice, the source region 23 and the P-type region 31 are shorted by a metallic contact which straddles both regions.

Appropriate contact openings, not shown, are provided in the gate oxide layer 29 for the source region 23, the drain region 25, and the P-well contact region 31.

The P-channel transistor 15 is formed in an N-well 33 formed in the substrate 11. The N-well 33 has a retrograde impurity concentration wherein the peak impurity concentration is substantially below the substrate surface, instead of at the surface. The N-well 33 extends beneath adjacent trenches 17 and extends further downwardly into the substrate 11 beneath the trenches 17. By way of example, the peak impurity concentration is about 1 micron relative to the top surfaces of the substrate 11.

The P-channel transistor 15 includes a P-type drain region 35 and a P-type source region 37. The drain region 35 and source region 37 are substantially separated from the peak impurity concentration of the N-well 33 as a result of the retrograde impurity concentration profile. By way of example, the source and drain regions have depths of about one-fourth of a micron. A polysilicon gate 39 is located above the N-well portion between the drain region 35 and the source region 37, and is isolated by a gate oxide layer 41. The gate oxide layer 41 merges into the field oxide 19 in the trenches 17, and a "bird's beak" 19a is formed.

A heavily doped N-type region 43 is formed in the N-well 33 to provide a contact for the N-well 33 which is generally connected to the supply voltage (connection not shown). The N-type region 43 is usually contiguous to the source region 37. In practice, the source region 37 and the N-type region 43 are shorted by a metallic contact which straddles both regions.

Appropriate contact openings, not shown, are provided in the gate oxide layer 41 for the drain region 35, the source region 37, and the N-well contact region 43.

A heavily doped P-type field region 45 surrounds the P-well 21, and a heavily doped N-type field region 47 surrounds the N-well 33. The heavily doped P type region 31, which provides a contact for the P-well 21, is adjacent and very close to the field region 45. The heavily doped N-type region 43, which provides a contact for the N-well 33, is adjacent and very close to the field region 47. The field regions 45 and 47 are highly conductive layers which tend to prevent field inversion and aid in preventing latch-up.

The field regions 45 and 47 are of opposite type and are adjacent one another in the trenches 17 separating devices of opposite type, such as the transistors 13 and 15. In the trenches 17 separating devices of the same type, such as the transistors 13 and 13a shown in in FIG. 2, a field region of one type would extend between the sides of the trenches. Specifically, between the transistors 13 and 13a, a heavily doped P-type field region is provided.

Figure 3:
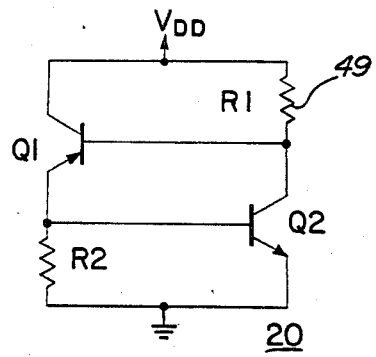
FIG. 3 is a schematic diagram of an equivalent circuit of the parasitic transistors in the CMOS structure shown in FIGS. 1 and 2.

The various N-type and P-type regions in the two transistor section 10 (FIGS. 1 and 2), and the typical connections to supply voltage and ground (discussed above) cooperate to promote unwanted bipolar transistor conduction. Such bipolar transistor conduction is illustrated by the equivalent circuit 20 shown in FIG. 3, which will also be discussed in connection with the latch-up suppression advantges of the disclosed CMOS structure.

The equivalent circuit 20 includes a resistor R1 which is connected between the supply voltage, identified as $V_{DD}$, and the base of a PNP transistor Q1. A resistor R2 is connected between the base of an NPN transistor Q1 and ground. The emitter of the PNP transistor Q1 is coupled to the supply voltage $V_{DD}$, and the collector of the PNP transistor Q1 is connected to the base of an NPN transistor Q2. The collector of the NPN transistor Q2 is coupled to the node formed by one end of the resistor R1 and the base of the PNP transistor Q1. The emitter of the NPN transistor Q2 is connected to ground.

In the equivalent circuit 20, the resistor R1 represents the resistance of the N-well 33 and the substrate 11. The resistor R2 represents the resistance of the P-well 21. The source region 37 of the P-channel transistor 15 forms the emitter of the PNP transistor Q1; the N-well 33 and the substrate 11 form the the base of Q1; and the P-well 21 forms the collector of Q1. The source region 23 of the N-channel transistor 13 forms the emitter of the NPN transistor Q2; the P-well 21 forms the base of Q2; and the N-well 33 and the substrate 11 form the collector of Q2.

In order for latch-up to occur, the base-emitter junctions of the transistors Q1 and Q2 must be forward biased, and the product of the current gains of the transistors Q1 and Q2 must be one or greater.

In the disclosed CMOS structure, the effective resistance values for R1 and R2 are reduced by the field regions 45 and 47. More importantly, the current gains of transistors Q1 and Q2 are substantially reduced since (1) the retrograde impurity profiles of the N- and P-wells present doping impurity concentration gradients which create retarding fields; and (2) the N- and P-well formations extend under and downwardly beneath the trenches 17. The built-in field due to the impurity concentration gradient enhances the collection of any minority carriers before such minority carriers can forward bias any junctions.

The above-described structure is fabricated in a lightly doped N-type 20 ohm-cm silicon substrate or wafer. A thermal oxide layer having a thickness of about 300 Angstroms is grown on the silicon substrate, which is followed by a deposition of a silicon nitride layer having a thickness of about 1500 Angstroms. Photoresist is then applied and exposed with an appropriate mask to define a photoresist mask to protect the active areas. Planar plasma etching is utilized to etch the nitride layer between the active areas (i.e., to etch nitride layer over the substrate regions where trenches will be formed). The wafer is then dipped in buffered hydrofluoric (HF) acid to dissolve the unprotected oxide layer between the active areas.

At this point, the active areas are protected by the photoresist mask and the substrate regions between the active areas are unprotected. The trenches are formed in such unprotected regions by plasma etching using a planar plasma machine. The trenches are etched to a depth of about 6000 Angstroms relative to the top of the substrate in the active areas.

To form the P-wells, photoresist is applied, exposed and developed to provide a photoresist mask to cover and protect the P-channel device areas and the associated well and field regions (i.e., the N-well region 33 and the field regions 47 shown in FIGS. 1 and 2). High energy boron having a projected ion implantation range ($R_p$) of greater than 5000 Angstroms is implanted for a dose of about $10^{13}/cm^2$. The high energy boron penetrates the oxide and nitride layers to form the P-wells which extend to a depth about 2.0 microns relative to the upper surfaces of the silicon substrate. The P-well regions are also formed deeper under the trench regions, as shown in FIG. 1 with respect to the P-well 21.

The wafer is subsequently implanted with boron at about 15 KeV and a dosage of about $10^{15}/cm^2$. This implant does not penetrate the active regions which are protected by the oxide and nitride layers, but forms the highly conductive P-type field regions, as shown in FIG. 1 with respect to the P-type field regions 45.

Next, an aluminum layer having a thickness of about 1 micron is deposited. The photoresist layer is then lifted, leaving the aluminum layer as a mask over the P-well regions. The N-well regions are then processed in a manner similar to the processes for the P-well regions. Specifically, phosphorous is implanted at high energy to form the N-wells which extend beneath the trenches. The highly conductive N-type field regions are formed by implantation of low energy phosphorous which does not penetrate the active areas which are protected by the oxide and nitride layers. The dosage of the phosphorous field implant can be adjusted to obtain the desired zener breakdown voltage between the N-type field region and the P-type region.

The foregoing described processes utilize a single P-well mask to form P-well regions and the highly conductive P-type field regions for the N-channel devices. A single N-well mask is utilized to form the N-well regions and the highly conductive N-type field regions for the P-channel devices. The lift-off technique provides for self-alignment between the respective P-well (for N-channel devices) and N-well (for P-channel devices) masks, which is accomplished with a single photoresist procedure. Such self-alignment is believed to provide high device density and high yields.

After the well and field regions are formed, the aluminum mask layer is stripped off, and field oxide is grown at low temperature in steam. The field oxide is grown to provide a thickness of about 6000 Angstroms in the trench regions.

With the foregoing fabrication process, the field regions 45 and 47 are separated from the active regions in a self-aligned manner, and are specifically separated from the source and drain regions by the trenches 17 and the bird's beak 19a. Therefore, the field regions 45 and 47 can be heavily doped without running the risk of low avalanche breakdown voltage of the diode formed by a drain region and a respective well. The high conductivity associated with such heavy doping decreases the positive feedback action necessary for latch-up, and also increases the radiation hardness of the field regions.

Conventional processing is then utilized to provide the gate contacts, source and drain implants, and appropriate contacts.

It should be noted that in the foregoing described integrated circuit structure and process, it is not necessary that the retrograde impurity concentration profile go to zero at the surface of the substrate 11. The retrograde impurity profile cooperates with other aspects of the integrated circuit to prevent latch-up. Specifically, the retrograde impurity concentration profile presents a concentration gradient which tends to enhance minority carrier recombination. The wells which extend beneath the trenches provide a higher number of majority type carriers, thus providing for increased recombination. The longer paths for conduction imposed by the trenches and the deeper N- and P-wells also provide for increased recombination. Thus, since minority carrier current is mostly collected in the base regions of the parasitic bipolar transistors, the betas of the parasitic bipolar transistors are substantially reduced, thereby preventing latch-up.

The disclosed structure has further advantageous features. The retrograde impurity concentration profiles of the respective P- and N-wells extend beneath the trenches 17, thereby providing built-in fields which tend to sweep any stray minority carriers toward the interface between the substrate 11 and the field oxide 19, to be collected by the heavily doped field regions 45 and 47. Also, the proximity of the doped regions 31 and 43, which provide respective well contacts, to the field regions 45 and 47, respectively allow for low resistance paths between the doped region 31 and the field region 45, and between doped region 43 and the field region 47. The significance of the low resistance paths thus provided is best understood with reference to the Fang and Moll article previously cited. The authors of that article concluded that when the doped regions provided as tie-down contacts are placed close to the well boundaries, most of the injected base current would not contribute to forward biasing a junction, thereby resulting in a much larger holding current required to sustain latch-up. In the disclosed invention, the doped regions 31 and 43 provided for tie-down contacts are coupled to the field regions 45 and 47 by very low resistance paths. The doped regions 31 and 35 thereby provide the same effect as if they were located at the boundaries of the wells since the field regions 45 and 47 are at the well boundaries. Thus, the disclosed field regions and well regions tend to prevent latch-up.

The disclosed integrated circuit is latch-up resistant and, therefore, allows for smaller transistor devices and denser device packing while maintaining high yields. Such reductions in scale result in faster speeds since CMOS devices are basically surface field devices.

A further benefit of the disclosed integrated circuit structure is an increased source-drain breakdown voltage since (1) deep well impurity concentration peaks improve source/drain punch through, and (2) the source and drain regions are substantially separated from the heavily doped field regions.

Another way of understanding the disclosed integrated circuit is to consider the individual devices as being formed in individual mesas. Such mesas provide some degree of isolation between the individual transistor devices. Isolation is further accomplished by the well formations, the well retrograde profile, and the highly doped field regions.

While the foregoing has been a description of preferred embodiments of the invention, modifications and changes thereto can be readily made by persons skilled in the art without departing from the scope and spirit of the invention as defined by the following claims.

What is claimed is:

1. A complementary metal oxide semiconductor (CMOS) structure comprising:
    a semiconductor substrate;
    a trench region formed in said substrate;
    a first retrograde well region of a first conductivity type formed in said substrate and having (a) an upper portion adjacent said trench region and (b) a lower portion beneath said trench region, said upper and lower portions merging together and having substantially the same depth;
    a second retrograde well region of a second conductivity type formed in said substrate and having (a) an upper portion adjacent said trench region and (b) a lower portion beneath said trench region, said upper and lower portions merging together and having substantially the same depth, said upper portions of said first and second retrograde well regions being separated by said trench region and said lower portions of said first and second retrograde well regions being adjacent one another;
    first and second metal oxide semiconductor (MOS) devices respectively formed in said first and second retrograde well regions; and
    first and second heavily doped field regions respectively formed in said first and second retrograde well regions beneath and contiguous to said trench region, said first and second heavily doped regions being separated from said first and second MOS devices.

2. The CMOS structure of claim 1 wherein said first retrograde well region comprises a P-well and said second retrograde well comprises an N-well.

3. The CMOS structure of claim 1 wherein said first and second heavily doped field regions are respectively aligned relative to said first and second retrograde wells.

4. The CMOS structure of claim 1 further including field oxide within said trench region.

5. A complementary metal oxide semiconductor (CMOS) structure comprising:
    a semiconductor substrate;
    a first mesa formed in said semiconductor substrate and having a first metal oxide semiconductor (MOS) device, said first MOS device having source and drain regions;
    a second mesa formed in said semiconductor substrate and having a second MOS device, said second MOS device having source and drain regions;
    a trench region separating said first and second mesas;
    a first retrograde well of a first conductivity type formed in said first mesa and extending beneath said trench, said first well having an impurity concentration peak separated from said source and drain regions of said first MOS device;
    a second retrograde well of a second conductivity type formed in said second mesa and extending beneath said trench, said second well having an impurity concentration peak separated from said source and drain regions of said second MOS device; and
    first and second heavily doped field regions formed in said first and second wells beneath and contiguous to said trench region, said first and second field regions being separated from said first and second MOS devices.

6. The CMOS structure of claim 5 wherein said first and second wells are contiguous beneath said trench.

7. The CMOS structure of claim 6 wherein said first and second heavily doped field regions are respectively aligned with said first and second wells.

* * * * *

UNITED STATES PATENT AND TRADEMARK OFFICE
CERTIFICATE OF CORRECTION

PATENT NO. : 4,683,488

DATED : July 28, 1987

INVENTOR(S) : LEE ET AL

It is certified that error appears in the above-identified patent and that said Letters Patent is hereby corrected as shown below:

Column 4, line 67, "Q2" instead of "Q1".

Column 4, line 68, "collector" instead of "emitter".

Column 5, line 1, "emitter" instead of "collector".

Column 5, line 2, "the" instead of "an".

Signed and Sealed this

Nineteenth Day of April, 1988

Attest:

DONALD J. QUIGG

*Attesting Officer*    *Commissioner of Patents and Trademarks*